(12) United States Patent
Shu

(10) Patent No.: US 9,077,320 B2
(45) Date of Patent: Jul. 7, 2015

(54) METHOD AND APPARATUS FOR PERFORMING OFFSET ADJUSTMENT UPON DYNAMIC COMPARATOR

(71) Applicant: MEDIATEK INC., Hsin-Chu (TW)

(72) Inventor: Yun-Shiang Shu, Hsinchu County (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/028,557

(22) Filed: Sep. 17, 2013

(65) Prior Publication Data

US 2014/0077860 A1    Mar. 20, 2014

Related U.S. Application Data

(60) Provisional application No. 61/703,450, filed on Sep. 20, 2012.

(51) Int. Cl.
| | |
|---|---|
| H03K 5/22 | (2006.01) |
| H03K 5/153 | (2006.01) |
| H03K 5/003 | (2006.01) |
| H03K 5/24 | (2006.01) |
| H03M 1/36 | (2006.01) |

(52) U.S. Cl.
CPC ............. *H03K 5/003* (2013.01); *H03M 1/361* (2013.01); *H03K 5/2481* (2013.01)

(58) Field of Classification Search
CPC ...... H03K 5/003; H03K 5/007; H03K 5/2481
USPC ................................. 327/67, 68, 87
See application file for complete search history.

(56) References Cited

U.S. PATENT DOCUMENTS

| | | | | |
|---|---|---|---|---|
| 6,034,551 | A * | 3/2000 | Bridgewater, Jr. | ............... 326/82 |
| 7,309,977 | B2 * | 12/2007 | Gray et al. | ..................... 323/284 |
| 8,514,113 | B2 * | 8/2013 | Hoshino | ....................... 341/118 |

OTHER PUBLICATIONS

Shu, A 6b 3GS/s 11mW Fully Dynamic Flash ADC in 40nm CMOS with Reduced Number of Comparators, 2012 Symposium on VLSI Circuits Digest of Technical Papers, pp. 26-27, 2012.
Van Der Plas, A 0.16pJ/Conversion-Step 2.5mW 1.25GS/s 4b ADC in a 90nm Digital CMOS Process, ISSCC 2006/Session 31/Very High-Speed ADCs and DACs/31.1, 2006.

* cited by examiner

*Primary Examiner* — Kenneth Wells
(74) *Attorney, Agent, or Firm* — Winston Hsu; Scott Margo

(57) ABSTRACT

An offset adjustment circuit of a dynamic comparator has a detection unit and a control unit. The detection unit detects whether a comparator offset possessed by the dynamic comparator is deviated from a target offset setting, and accordingly generates a detection result. The control unit adjusts a voltage setting of at least one input received by the dynamic comparator when the detection result indicates that the comparator offset is deviated from the target offset setting.

14 Claims, 5 Drawing Sheets

METHOD AND APPARATUS FOR PERFORMING OFFSET ADJUSTMENT UPON DYNAMIC COMPARATOR

CROSS REFERENCE TO RELATED APPLICATIONS

This application claims the benefit of U.S. provisional application No. 61/703,450, filed on Sep. 20, 2012 and incorporated herein by reference.

BACKGROUND

The disclosed embodiments of the present invention relate to a dynamic comparator, and more particularly, to an apparatus and method for performing offset adjustment upon a dynamic comparator.

In today's world where demand for portable devices powered by battery devices is increasing, a major thrust is given towards low power methodologies for high resolution and high speed applications. This reduction in power can be achieved by moving towards smaller feature size processes. However, when smaller feature size processes are adopted, the process variations and other non-idealities will greatly affect the overall performance of the devices. One such application where low power, high resolution and high speed are required is an analog-to-digital converter (ADC) for a portable device. In the past, pre-amplifier based comparators have been used for ADC architecture such as a flash ADC. The main drawback of pre-amplifier based comparators is the high constant power consumption. To overcome this problem, dynamic comparators are used. Dynamic comparators consume power only when making signal comparison. There is no static current, thus requiring much less power as compared to the pre-amplifier based comparators.

Compared to the flash ADC using pre-amplifier based comparators, a fully dynamic flash ADC is realized without track/hold circuits, resistor strings and pre-amplifiers, and the only analog signal is the input signal to be converted into a digital output, where each dynamic comparator senses the input signal around the clock edge and compares the input signal with its built-in offset which is equivalent to a reference voltage used by a pre-amplifier based comparator.

In general, a bias condition of the dynamic comparator would affect the comparator offset possessed by the dynamic comparator. The bias condition of the dynamic comparator may vary due to certain factors. For example, the comparator offset is very sensitive to supply voltage variation, temperature variation, etc. Consequently, the comparator offset becomes a major concern in practical applications.

SUMMARY

In accordance with exemplary embodiments of the present invention, an apparatus and method for performing offset adjustment upon a dynamic comparator are proposed to solve the above problem.

According to a first aspect of the present invention, an exemplary offset adjustment circuit of a dynamic comparator is disclosed. The exemplary offset adjustment circuit includes a detection unit and a control unit. The detection unit is arranged for detecting whether a comparator offset possessed by the dynamic comparator is deviated from a target offset setting, and accordingly generating a detection result. The control unit is arranged for adjusting a voltage setting of at least one input received by the dynamic comparator when the detection result indicates that the comparator offset is deviated from the target offset setting.

According to a second aspect of the present invention, an exemplary offset adjustment method of a dynamic comparator is disclosed. The exemplary offset adjustment method includes at least the following steps: detecting whether a comparator offset possessed by the dynamic comparator is deviated from a target offset setting, and accordingly generating a detection result; and adjusting a voltage setting of at least one input received by the dynamic comparator when the detection result indicates that the comparator offset is deviated from the target offset setting.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
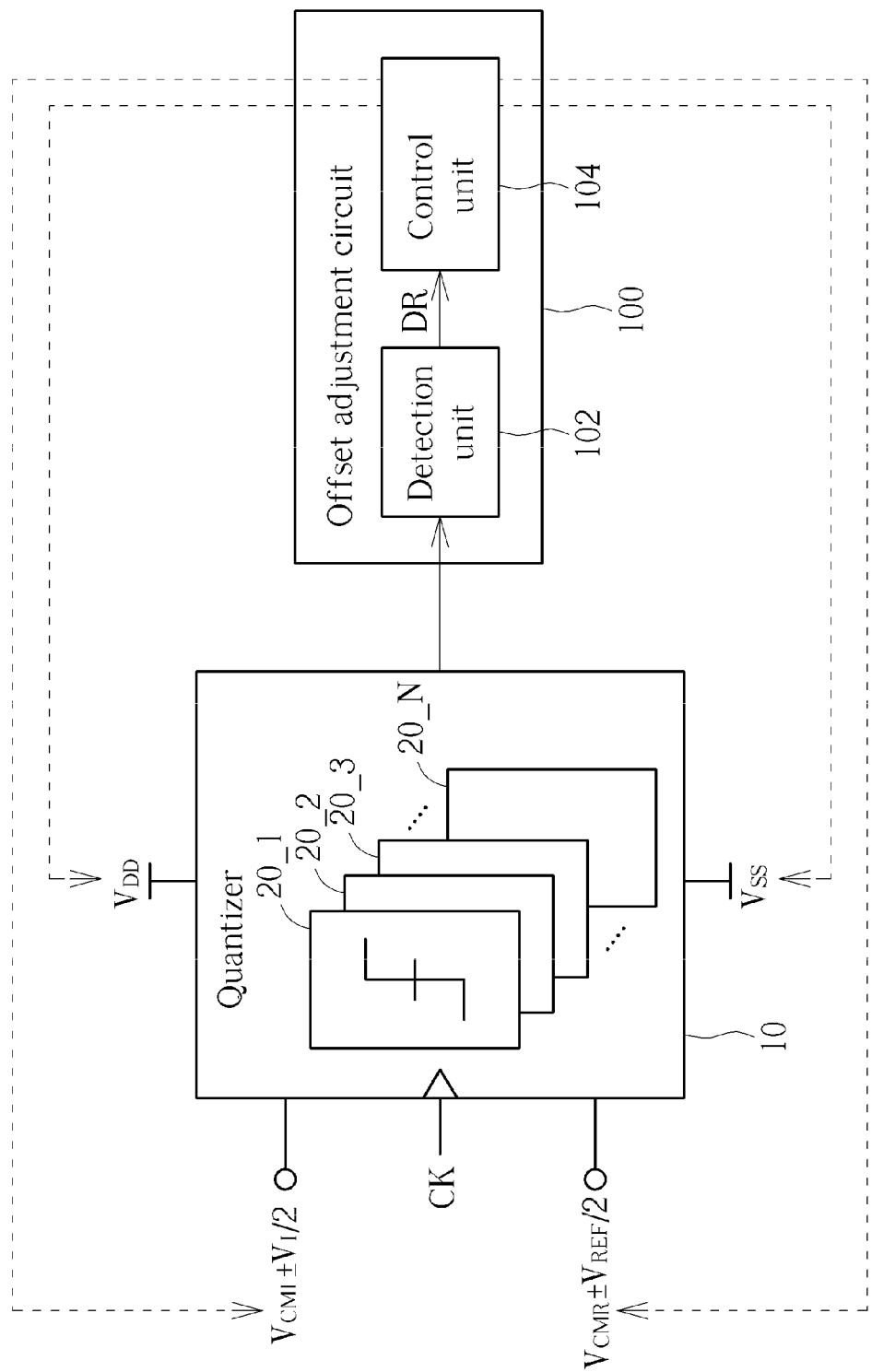
FIG. 1 is a diagram illustrating an offset adjustment circuit according to an embodiment of the present invention.

FIG. 1 is a diagram illustrating an offset adjustment circuit according to an embodiment of the present invention. The offset adjustment circuit 100 may be employed to adjust comparator offsets of dynamic comparators 20_1, 20_2, 20_3, . . . , 20_N implemented in a quantizer 10, where N may be any positive number. That is, the quantizer 10 may have one or more dynamic comparators, depending upon the actual design requirement; and the offset adjustment circuit 100 is capable of adjusting the comparator offset of at least one dynamic comparator. The quantizer 10 may be an ADC (e.g., a flash ADC) or just part of a signal processing circuit which requires analog-to-digital conversion.

Figure 2:
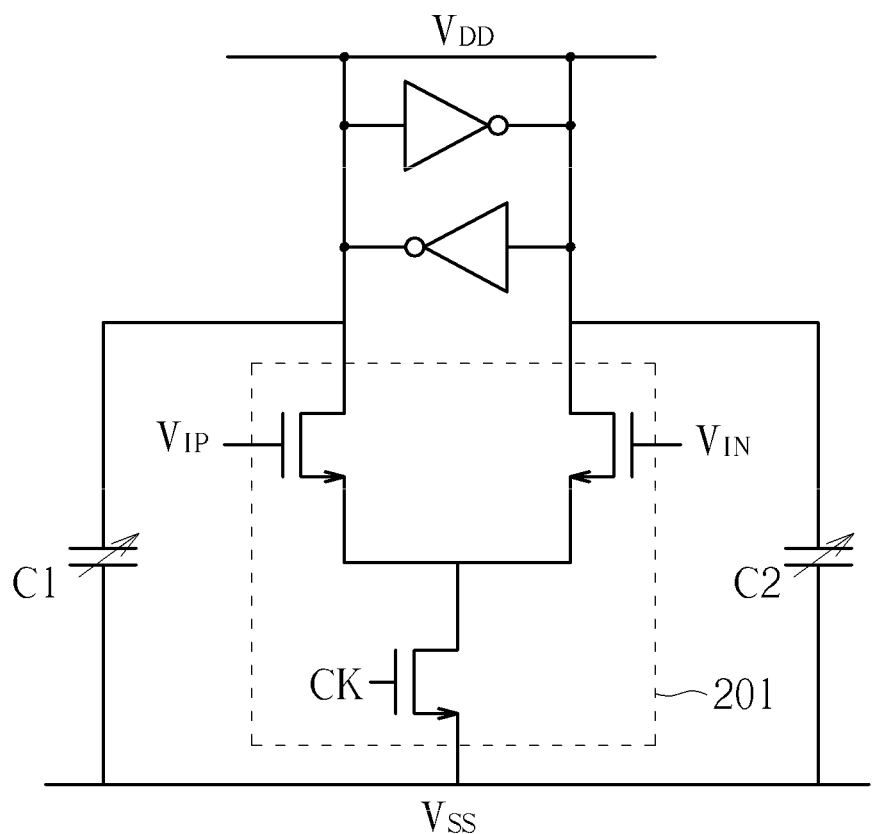
FIG. 2 is a circuit diagram of a dynamic comparator using two common methods to introduce a comparator offset.

FIG. 2 is a circuit diagram of a dynamic comparator using two common methods to introduce a comparator offset. One is to create an imbalanced input pair, as shown in the dashed rectangle 201. The other is to add imbalanced capacitor loading, as shown by tunable capacitors C1 and C2. There are other methods to create imbalanced structure in order to introduce comparator offset. The ΔW in the following content refers to the difference of the input pair, the difference of the capacitor values, or the difference of the other imbalanced components.

Figure 3:
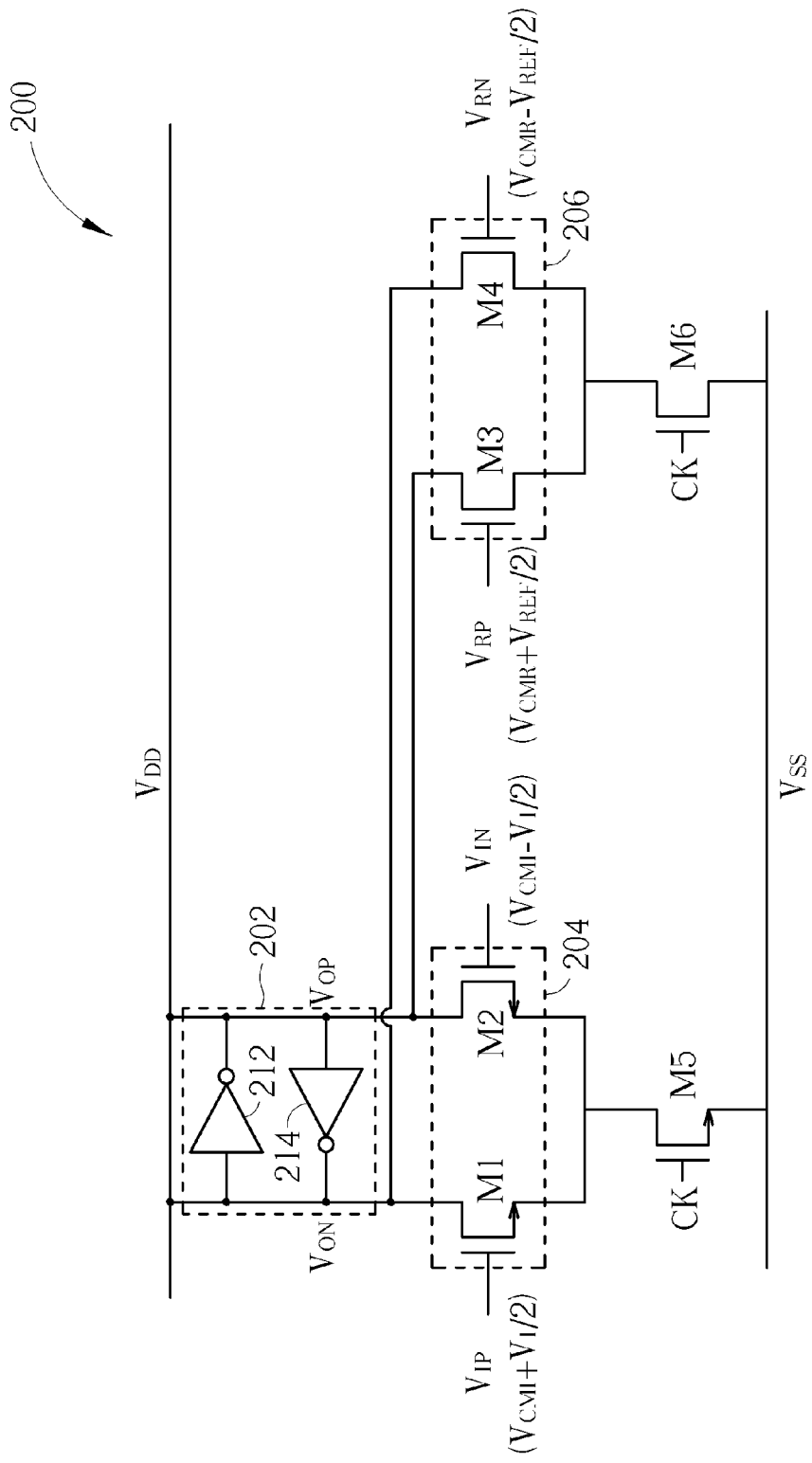
FIG. 3 is a circuit diagram of a dynamic comparator according to an embodiment of the present invention.

Please refer to FIG. 3, which is a circuit diagram of a dynamic comparator according to an embodiment of the present invention. Each of the dynamic comparators 20_1-20_N shown in FIG. 1 may be realized using the exemplary dynamic comparator 200 shown in FIG. 3. However, this is not meant to be a limitation of the present invention. That is, the proposed offset adjustment scheme may also be applied to a dynamic comparator with a different circuit structure.

As shown in FIG. 3, the dynamic comparator 200 is operated under distinct supply voltages $V_{DD}$ and $V_{SS}$. Specifically, the supply voltages $V_{DD}$ and $V_{SS}$ may be regarded as reference voltages with different voltage levels, where $V_{DD}$>$V_{SS}$. In addition to the supply voltages $V_{DD}$ and $V_{SS}$, the dynamic comparator 200 receives other inputs for achieving its intended purpose. As shown in FIG. 3, the dynamic comparator 200 includes a latch stage 202 composed of inverters 212, 214, a first input stage 204 composed of transistors M1, M2, a second input stage 206 composed of transistors $M_3$, $M_4$, and a plurality of tail transistors $M_5$, $M_6$ controlled by a clock signal CK. During one clock cycle of the clock signal CK, the dynamic comparator 200 is arranged to perform the signal comparison once. Hence, during one clock cycle of the clock signal CK, the dynamic comparator 200 receives an input signal $V_I$ through the first input stage 204, receives a reference voltage $V_{REF}$ through the second input stage 206, and compares the input signal $V_I$ with its comparator offset to generate an output signal (e.g., a differential output composed of $V_{OP}$ and $V_{ON}$). In this embodiment, the input signal $V_I$ is transmitted via a differential input composed of $V_{IP}$ and $V_{IN}$, where $V_{IP}=V_{CMI}+(V_{IN}/2)$, $V_{IN}=V_{CMI}-(V_{IN}/2)$, and $V_{CMI}$ is a common-mode voltage of the differential input to be compared; and the reference voltage $V_{REF}$ is transmitted via a differential voltage composed of $V_{RP}$ and $V_{RN}$, where $V_{RP}=V_{CMR}+(V_{REF}/2)$, $V_{RN}=V_{CMR}-(V_{REF}/2)$, and $V_{CMR}$ is a common-mode voltage of the differential reference voltage. When the input signal $V_I$ is greater than the comparator offset, the comparator output would indicate a first logic value (e.g., "1"), and when the input signal $V_I$ is not greater than the comparator offset, the comparator output would indicate a second logic value (e.g., "0"). As a person skilled in the pertinent art can understand operational principle of the circuit structure of the dynamic comparator 200 shown in FIG. 3, further description is omitted here for brevity.

The hardware of the dynamic comparators 20_1-20_N is particularly designed to make the dynamic comparators 20_1-20_N have different inherent comparator offsets (i.e., built-in offsets) as required by the quantizer 10. However, during the normal operation of the dynamic comparators 20_1-20_N, the bias condition of the dynamic comparators 20_1-20_N may vary due to certain factors, and the variation of the bias condition of the dynamic comparators 20_1-20_N may result in the variation of the comparator offsets. The comparator offset OFFSET$_i$ of the ith dynamic comparator in the quantizer 10 may be expressed using the following equation.

$$K \times \Delta W_i = \text{OFFSET}_i \quad (1)$$

In above equation, K is a parameter, and $\Delta W_i$ is the inherent comparator offset. For example, the inherent comparator offset $\Delta W_i$ may result from mismatch of transistor pair(s); and the parameter K includes effects of many different factors, and is dominated by the bias condition including process, voltage, temperature, etc. As the dynamic comparators 20_1-20_N have the same bias condition, the actual comparator offsets of the dynamic comparators 20_1-20_N are still proportional to respective inherent comparator offsets $\Delta W_i$. In other words, when the value of K increases, every comparator offset increases proportionally. The present invention therefore proposes using the offset adjustment circuit 100 to detect occurrence of the comparator offset variation and then adjust one or more settings of the bias condition to restore the value of K to a desired one.

As shown in FIG. 1, the offset adjustment circuit 100 has a detection unit 102 and a control unit 104. The detection unit 102 is used for comparator offset variation detection. That is, the detection function of the detection unit 102 is able to determine if the comparator offset is equal to a desired value or falls within a desired range. The detection unit 102 may monitor a comparator output of one of the dynamic comparators 20_1-20_N, and generate a detection result DR by detecting whether a comparator offset possessed by the monitored dynamic comparator (e.g., 20_1) is deviated from a target offset setting (e.g., a desired value or a desired range) requested by the quantizer 10. By way of example, but not limitation, the detection unit 102 may check if successive comparator outputs of the monitored dynamic comparator within a predetermined period of time (i.e., a predetermined number of clock cycles) all have the same logic value, either 1's or 0's. If the monitored dynamic comparator has a correct offset setting, the successive comparator outputs should have equal numbers of different logic values. Hence, the detection unit 102 determines that the comparator offset variation occurs when detecting a plurality of successive comparator outputs having imbalanced numbers of different logic values.

The control unit 104 is coupled to the detection unit 102, and is configured to operate in response to the detection result DR generated from the detection unit 102. When the detection result DR indicates that the comparator offset of the monitored dynamic comparator (e.g., 20_1) is not deviated from the target offset setting, no offset adjustment/compensation is enabled by the control unit 104. However, when the detection result DR indicates that the comparator offset of the monitored dynamic comparator (e.g., 20_1) is deviated from the target offset setting, the control unit 104 is operative to adjust a voltage setting of at least one input received by the dynamic comparators 20_1-20_N. It should be noted that the bias condition of each of the dynamic comparators 20_1-20_N is affected by several factors such as supply voltages $V_{DD}$, $V_{SS}$ and common-mode voltages $V_{CMI}$, $V_{CMR}$. As can be known from above equation (1), the thresholds (i.e., comparator offsets) of the dynamic comparators 20_1-20_N connected to the same supply voltages $V_{DD}$, $V_{SS}$ and common-mode voltages $V_{CMI}$, $V_{CMR}$ would change together when at least one of supply voltages $V_{DD}$, $V_{SS}$ and common-mode voltages $V_{CMI}$, $V_{CMR}$ varies.

As shown in FIG. 1 and FIG. 3, each of the dynamic comparators 20_1-20_N receives an input signal VIN to be compared with an internal comparator offset. In a first exemplary design of the control unit 104, the at least one input mentioned above may include the input signal $V_{IN}$. More specifically, in a case where the input signal $V_{IN}$ is a differential signal composed of $V_{IP}$ and $V_{IN}$, the voltage setting adjusted by the control unit 104 may be the common-mode voltage $V_{CMI}$ of the differential signal.

In a dynamic comparator, the comparator offset means the comparator threshold (i.e. reference voltage. The reference voltage can also be provided by real voltages, as shown in FIG. 3. It can be achieved by including another input pair connected to a reference voltage. In this case, the offset calibration can be done though $V_{CMI}$, $V_{CMR}$, but not $V_{DD}$, $V_{SS}$.

As shown in FIG. 1 and FIG. 3, each of the dynamic comparators 20_1-20_N may also receive a reference voltage $V_{REF}$. In a second exemplary design of the control unit 104, the at least one input mentioned above may include the reference voltage $V_{REF}$. More specifically, in a case where the reference voltage $V_{REF}$ is a differential voltage of $V_{RP}$ and $V_{RN}$, the voltage setting adjusted by the control unit 104 may be the common-mode voltage $C_{CMR}$ of the differential voltage.

As shown in FIG. 1 and FIG. 3, each of the dynamic comparators 20_1-20_N is operated under two supply voltages $V_{DD}$ and $V_{SS}$, where $V_{DD}$ and $V_{SS}$ may be regarded as reference voltages with different voltage levels. In a third exemplary design of the control unit 104, the at least one input mentioned above may include the supply voltage $V_{DD}$. More specifically, in a case where a reference voltage to be adjusted is the supply voltage $V_{DD}$, the voltage setting adjusted by the control unit 104 may be a voltage level of the supply voltage $V_{DD}$. In a fourth exemplary design of the control unit 104, the at least one input mentioned above may include the other supply voltage $V_{SS}$. More specifically, in a case where a reference voltage to be adjusted is the supply voltage $V_{SS}$, the voltage setting adjusted by the control unit 104 may be a voltage level of the supply voltage $V_{SS}$.

In each of above exemplary designs of the control unit 104, the control unit 104 is configured to adjust only one of the supply voltages $V_{DD}$, $V_{SS}$ and the common-mode voltages $V_{CMI}$, $V_{CMR}$. Alternatively, the control unit 104 may be configured to adjust more than one of the supply voltages $V_{DD}$, $V_{ss}$ and the common-mode voltages $V_{CMI}$, $V_{CMR}$. The same objective of mitigating/suppressing effects caused by the comparator offset variation and/or restoring the deviated comparator offset to a desired offset setting (e.g., a desired offset value or a desired offset range) is achieved.

With regard to the embodiment shown in FIG. 1, the detection unit 102 has to monitor the output of one of the dynamic comparators 20_1-20_N to detect occurrence of the comparator offset variation. Hence, during the detection procedure of comparator offset variation, the normal operation of the quantizer 10 has to be interrupted, and a particular input defined based on a target offset setting of the monitored dynamic comparator is fed into the monitored dynamic comparator. Hence, the detection unit 102 refers to successive comparator outputs of the monitored dynamic comparator to determine whether the comparator offset variation occurs. However, this is for illustrative purposes only, and is not meant to be a limitation of the present invention. In an alternative design, the input of the detection function may come from a replica comparator (i.e., a dummy comparator) rather than a dynamic comparator actually used by the quantizer. The detection function is performed in the background without interrupting the normal operation of the quantizer 10. In this way, the quantizer 10 is not required to provide an output of one dynamic comparator to serve as an input of the detection function.

Figure 4:
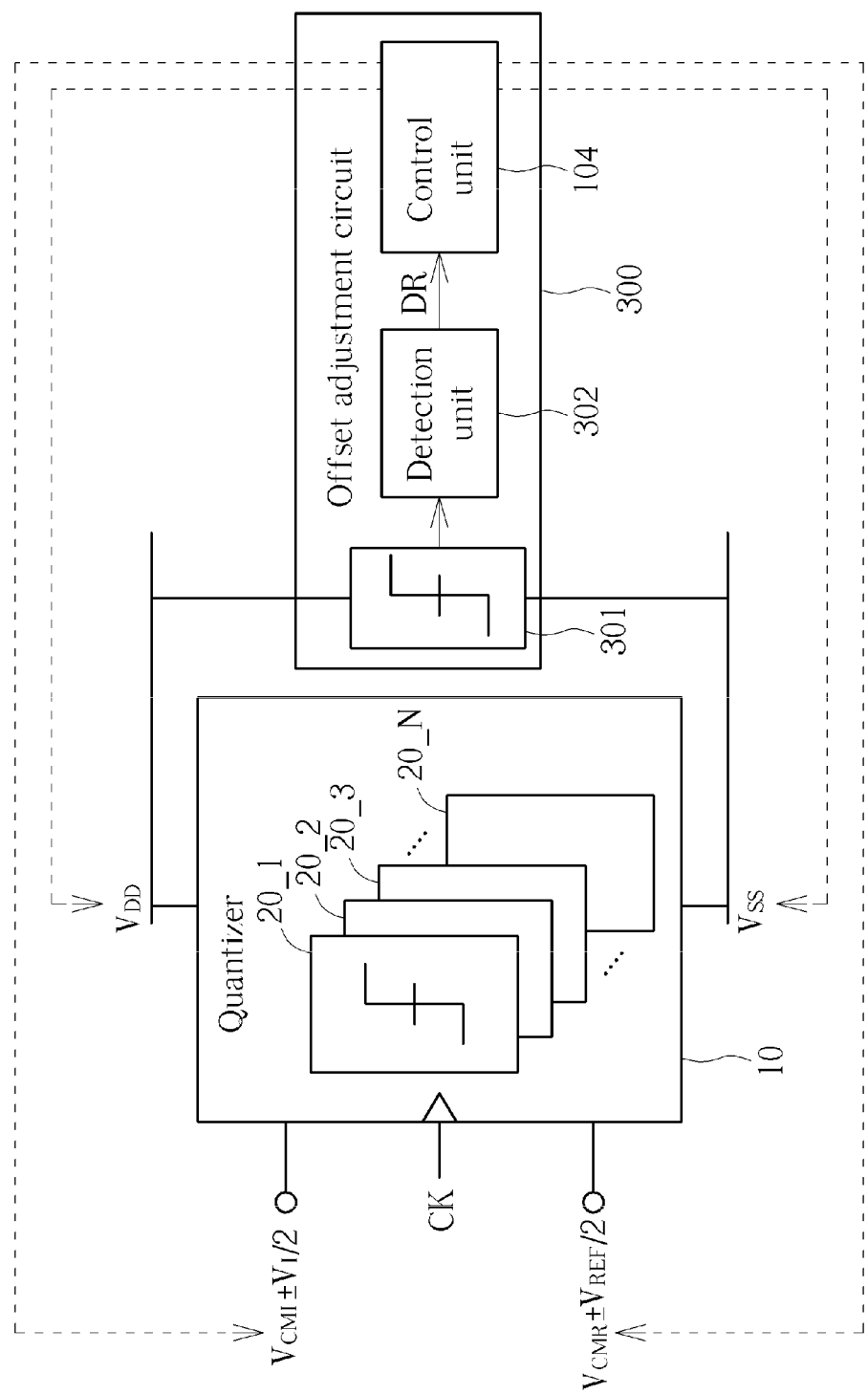
FIG. 4 is a diagram illustrating an offset adjustment circuit according to another embodiment of the present invention.

FIG. 4 is a diagram illustrating an offset adjustment circuit according to another embodiment of the present invention. In this embodiment, the offset adjustment circuit 300 includes a replica comparator 301, a detection unit 302, and the aforementioned control unit 104. The major difference between detection units 102 and 302 is that the detection unit 302 is arranged to detect occurrence of the comparator offset variation of the dynamic comparators 20_1-20_N by detecting whether a comparator offset possessed by the monitored replica comparator 301 is deviated from a target offset setting (e.g., a desired value or a desired range). By way of example, but not limitation, the detection unit 302 may check if successive comparator outputs of the monitored replica comparator 301 within a predetermined period of time (i.e., a predetermined number of clock cycles) all have the same logic value, either 1's or 0's. As the replica comparator 301 is configured to have the same bias condition possessed by the dynamic comparators 20_1-20_N, the detection unit 302 therefore detects the comparator offset variation of the dynamic comparators 20_1-20_N when finding that successive comparator outputs of the monitored replica comparator 301 within the predetermined period of time all have the same logic value.

Figure 5:
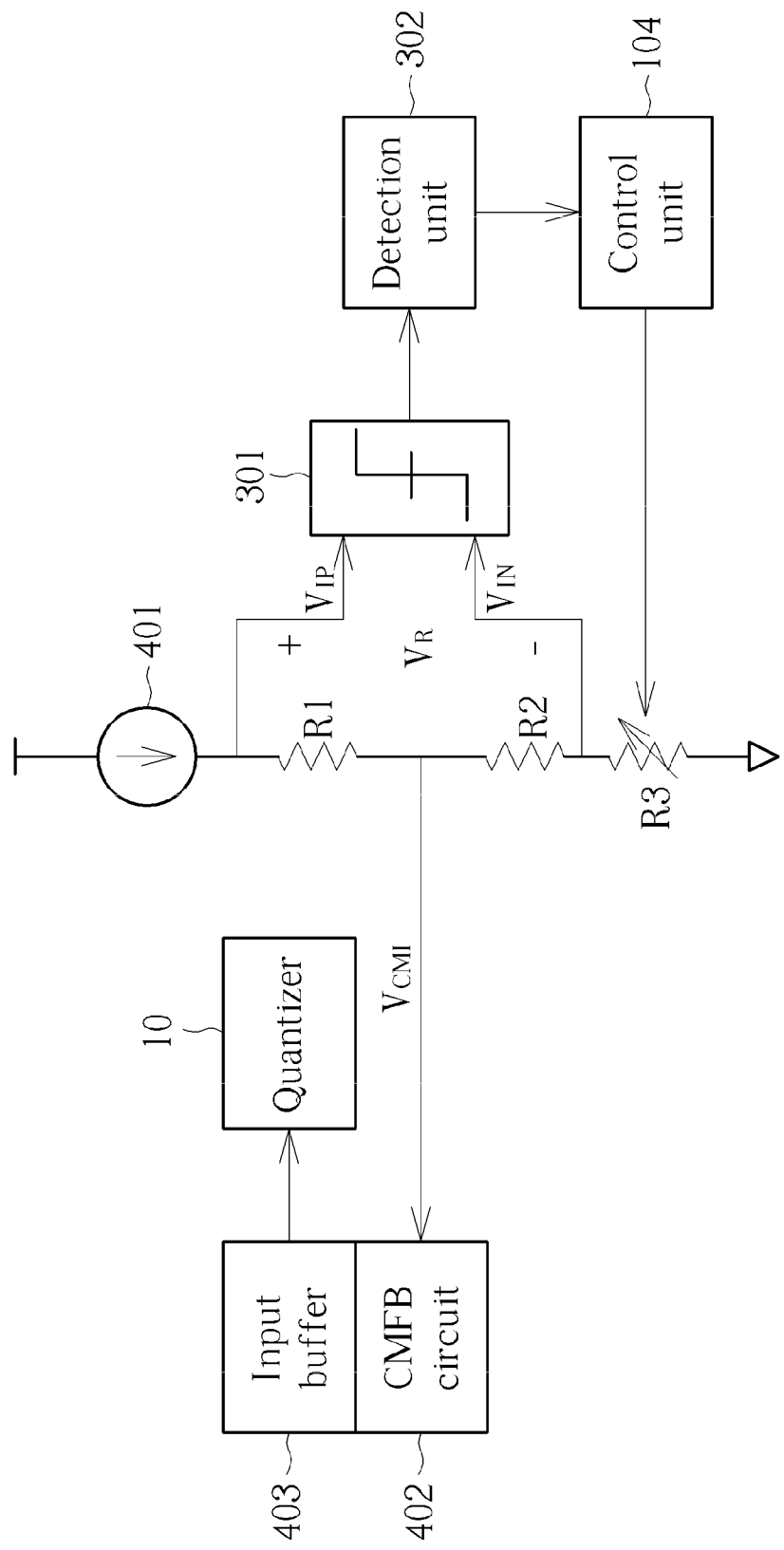
FIG. 5 is a diagram illustrating an exemplary background calibration loop based on the replica comparator shown in FIG. 4.

For better understanding of the background offset adjustment/calibration, an exemplary background calibration loop based on the replica comparator 301 is shown in FIG. 5. A predetermined voltage $V_R$ equal to a target offset value of the replica comparator 301 is generated through multiple resistors R1, R2 and one current source 401. The detection unit 302 and the control unit 104 collaborate on forcing the actual comparator offset to a constant reference (i.e., the predetermined voltage $V_R$) by shifting the common-mode voltage $V_{CMI}$ through tuning the variable resistor R3. As can be seen from FIG. 5, the same common-mode voltage $V_{CMI}$ is applied to the dynamic comparators 20_1-20_N of the quantizer 10 through a common-mode feedback (CMFB) circuit 402 of an input buffer 403. In this way, the comparator offsets of the dynamic comparators 20_1-20_N are adjusted to desired values respectively through the proposed background offset calibration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An offset adjustment method of a dynamic comparator, comprising:
   detecting whether a comparator offset possessed by the dynamic comparator is deviated from a target offset setting, and accordingly generating a detection result, wherein the step of detecting whether the comparator offset possessed by the dynamic comparator is deviated from the target offset setting comprises:
   monitoring a comparison output of a replica comparator to generate the detection result; and
   adjusting a voltage setting of at least one input received by the dynamic comparator when the detection result indicates that the comparator offset is deviated from the target offset setting;
   wherein the dynamic comparator receives an input signal to be compared with the comparator offset; and the step of adjusting the voltage setting of the at least one input comprises:
   adjusting the voltage setting of the input signal.

2. An apparatus for performing offset adjustment according to the offset adjustment method of claim 1.

3. The apparatus of claim 2, wherein the input signal is a differential signal, and the voltage setting is a common-mode voltage of the differential signal.

4. The offset adjustment method of claim 1, wherein the input signal is a differential signal, and the voltage setting is a common-mode voltage of the differential signal.

5. An offset adjustment method of a dynamic comparator, comprising:
   detecting whether a comparator offset possessed by the dynamic comparator is deviated from a target offset setting, and accordingly generating a detection result, wherein the step of detecting whether the comparator offset possessed by the dynamic comparator is deviated from the target offset setting comprises:
  monitoring a comparison output of a replica comparator to generate the detection result; and
  adjusting a voltage setting of at least one input received by the dynamic comparator when the detection result indicates that the comparator offset is deviated from the target offset setting;
  wherein the dynamic comparator receives a reference voltage; and the step of adjusting the voltage setting of the at least one input comprises:
  adjusting the voltage setting of the reference voltage;
  wherein the reference voltage is a differential voltage, and the voltage setting is a common-mode voltage of the differential voltage.

6. An apparatus for performing offset adjustment according to the offset adjustment method of claim 5.

7. An offset adjustment method of a dynamic comparator, comprising:
  detecting whether a comparator offset possessed by the dynamic comparator is deviated from a target offset setting, and accordingly generating a detection result, wherein the step of detecting whether the comparator offset possessed by the dynamic comparator is deviated from the target offset setting comprises:
  monitoring a comparison output of a replica comparator to generate the detection result; and
  adjusting a voltage setting of at least one input received by the dynamic comparator when the detection result indicates that the comparator offset is deviated from the target offset setting;
  wherein the dynamic comparator receives a reference voltage; and the step of adjusting the voltage setting of the at least one input comprises:
  adjusting the voltage setting of the reference voltage;
  wherein the dynamic comparator is operated under a first supply voltage and a second supply voltage; and the reference voltage is the first supply voltage.

8. An apparatus for performing offset adjustment according to the offset adjustment method of claim 7.

9. The apparatus of claim 8, wherein the voltage setting is a voltage level of the first supply voltage.

10. The apparatus of claim 8, wherein the first supply voltage is higher than the second supply voltage.

11. The apparatus of claim 8, wherein the first supply voltage is lower than the second supply voltage.

12. The offset adjustment method of claim 7, wherein the voltage setting is a voltage level of the first supply voltage.

13. The offset adjustment method of claim 7, wherein the first supply voltage is higher than the second supply voltage.

14. The offset adjustment method of claim 7, wherein the first supply voltage is lower than the second supply voltage.

* * * * *